United States Patent
Nam et al.

(10) Patent No.: US 10,573,767 B2
(45) Date of Patent: Feb. 25, 2020

(54) SOLAR CELL

(71) Applicant: LG Electronics Inc., Seoul (KR)

(72) Inventors: Heejin Nam, Seoul (KR); Yoonsil Jin, Seoul (KR); Sangwook Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 13/894,833

(22) Filed: May 15, 2013

(65) Prior Publication Data
US 2013/0340822 A1  Dec. 26, 2013

(30) Foreign Application Priority Data
Jun. 26, 2012 (KR) .................... 10-2012-0068443

(51) Int. Cl.
| | |
|---|---|
| *H01L 31/0224* | (2006.01) |
| *H01L 31/0216* | (2014.01) |
| *H01L 31/068* | (2012.01) |
| *H01L 31/18* | (2006.01) |

(52) U.S. Cl.
CPC ........... *H01L 31/022433* (2013.01); *H01L 31/02168* (2013.01); *H01L 31/022425* (2013.01); *H01L 31/068* (2013.01); *H01L 31/1804* (2013.01); *Y02E 10/547* (2013.01); *Y02P 70/521* (2015.11)

(58) Field of Classification Search
CPC ... H01L 31/022425–022433; H01L 31/02168; H01L 31/068; H01L 31/1804; Y02E 10/547; Y02P 70/521

USPC .................................................. 136/243–265
See application file for complete search history.

(56) References Cited

U.S. PATENT DOCUMENTS

| | | | | |
|---|---|---|---|---|
| 5,011,565 | A * | 4/1991 | Dube | H01L 31/022425 136/256 |
| 5,356,488 | A * | 10/1994 | Hezel | 136/256 |
| 9,202,948 | B2 * | 12/2015 | Lee | H01L 31/022433 |

(Continued)

FOREIGN PATENT DOCUMENTS

| | | |
|---|---|---|
| CN | 101764179 A | 6/2010 |
| CN | 102142479 A * | 8/2011 |

(Continued)

OTHER PUBLICATIONS

Oxford Dictionaries. "Definition of Bury". http://www.oxforddictionaries.com/us/definition/american_english/bury?q=buried. Accessed Jun. 2, 2016.*

*Primary Examiner* — Liesl C Baumann
(74) *Attorney, Agent, or Firm* — Dentons US LLP

(57) ABSTRACT

A solar cell includes a substrate containing impurities of a first conductive type, an emitter region which is positioned at a first surface of the substrate and contains impurities of a second conductive type opposite the first conductive type to form a p-n junction along with the substrate, an anti-reflection layer positioned on the emitter region, a first electrode which is positioned on the anti-reflection layer and is coupled to the emitter region, and a second electrode which is positioned on a second surface of the substrate and is coupled to the substrate. A first area of the anti-reflection layer, which is positioned under the first electrode, has a plurality of openings. The first electrode couples to the emitter region exposed through the plurality of openings.

13 Claims, 9 Drawing Sheets

(56) References Cited

U.S. PATENT DOCUMENTS

| | | | |
|---|---|---|---|
| 2009/0020156 A1* | 1/2009 | Ohtsuka | H01L 31/18 136/256 |
| 2010/0224228 A1 | 9/2010 | Kim et al. | |
| 2010/0275982 A1* | 11/2010 | Abbott | H01L 31/0352 136/255 |
| 2010/0319770 A1* | 12/2010 | Lee | H01L 31/022425 136/256 |
| 2011/0036402 A1* | 2/2011 | Ishihara et al. | 136/256 |
| 2011/0132448 A1 | 6/2011 | Payne et al. | |
| 2011/0139226 A1* | 6/2011 | Ha | H01L 31/022425 136/252 |
| 2011/0139236 A1 | 6/2011 | Lee et al. | |
| 2011/0139239 A1* | 6/2011 | Lee et al. | 136/256 |
| 2011/0143486 A1 | 6/2011 | Hama et al. | |
| 2011/0146765 A1* | 6/2011 | Ahn | H01L 31/022433 136/252 |
| 2012/0048366 A1* | 3/2012 | Mai | H01L 21/2254 136/256 |
| 2012/0060917 A1* | 3/2012 | Jin et al. | 136/256 |
| 2012/0090673 A1* | 4/2012 | Dimitrov et al. | 136/255 |
| 2012/0111396 A1* | 5/2012 | Saylor et al. | 136/255 |
| 2012/0118364 A1* | 5/2012 | Yang et al. | 136/255 |
| 2012/0222735 A1 | 9/2012 | Xu | |
| 2013/0284259 A1* | 10/2013 | Jin et al. | 136/256 |
| 2014/0076394 A1* | 3/2014 | Nam | H01L 31/022425 136/256 |

FOREIGN PATENT DOCUMENTS

| | | |
|---|---|---|
| CN | 102290488 A | 12/2011 |
| CN | 102292825 A | 12/2011 |
| JP | 64-89569 A | 4/1989 |
| JP | 07-142753 A | 6/1995 |
| JP | 2002-217430 A | 8/2002 |
| JP | 2004-531074 A | 10/2004 |
| JP | 2008-153670 A | 7/2008 |
| JP | 2008204967 A | 9/2008 |
| JP | 2009-206375 A | 9/2009 |
| KR | 1020100099449 A | 9/2010 |
| KR | 1020120023391 A | 3/2012 |
| WO | WO2010118479 A1 * | 10/2010 |

* cited by examiner

SOLAR CELL

This application claims priority to and the benefit of Korean Patent Application No. 10-2012-0068443 filed in the Korean Intellectual Property Office on Jun. 26, 2012, the entire contents of which are incorporated herein by reference.

BACKGROUND

Field of the Disclosure

Embodiments of the invention relate to a solar cell.

Background

Recently, as existing energy sources such as petroleum and coal are expected to be depleted, interests in alternative energy sources for replacing the existing energy sources are increasing. Among the alternative energy sources, solar cells for generating electric energy from solar energy have been particularly spotlighted.

A solar cell generally includes semiconductor parts, which respectively have different conductive types, for example, a p-type and an n-type, and thus form a p-n junction, and electrodes respectively connected to the semiconductor parts of the different conductive types.

When light is incident on the solar cell, electrons and holes are produced in the semiconductor parts. The electrons move to the n-type semiconductor part, and the holes move to the p-type semiconductor part under the influence of the p-n junction of the semiconductor parts. Then, the electrons and the holes are collected by the different electrodes respectively connected to the n-type semiconductor part and the p-type semiconductor part. The electrodes are connected to each other using electric wires to thereby obtain electric power.

SUMMARY

In one aspect, there is a solar cell including a substrate containing impurities of a first conductive type, an emitter region positioned at a first surface of the substrate, the emitter region containing impurities of a second conductive type opposite the first conductive type to form a p-n junction along with the substrate, an anti-reflection layer positioned on the emitter region, a first electrode which is positioned on the anti-reflection layer and is coupled to the emitter region, and a second electrode which is positioned on a second surface of the substrate and is coupled to the substrate, wherein a first area of the anti-reflection layer, which is positioned under the first electrode, has a plurality of openings, and the first electrode couples to the emitter region exposed through the plurality of openings of the anti-reflection layer.

The plurality of openings of the anti-reflection layer may be formed in the first area of the anti-reflection layer and may not be formed in a second area of the anti-reflection layer, in which the first electrode is not positioned.

The first area of the anti-reflection layer may include a finger area extending in a first direction and a bus bar area extending in a second direction crossing the first direction.

The plurality of openings formed in the first area of the anti-reflection layer may be positioned to be separated from one another. A plane shape of each of the plurality of openings may have a circular shape or a polygon shape.

A width of the finger area included in the first area of the anti-reflection layer may be about 5 µm to 20 µm. A maximum width of the plurality of openings may be equal to or less than about 4 µm, and a maximum distance between the plurality of openings may be equal to or less than about 5 µm.

The emitter region may include a lightly doped region having a first sheet resistance and a heavily doped region having a second sheet resistance less than the first sheet resistance. The heavily doped region may be positioned at the first area of the anti-reflection layer, and the lightly doped region may be positioned at the second area of the anti-reflection layer.

The heavily doped region may be positioned under the plurality of openings formed in the first area of the anti-reflection layer. The lightly doped region may be positioned in a remaining portion excluding the heavily doped region positioned at the plurality of openings formed in the first area of the anti-reflection layer.

The heavily doped region may be positioned under each of the plurality of openings and may be in plural. The plurality of heavily doped regions when viewed in the plane may be formed in an island shape and may be partially separated from one another or may be partially connected to one another.

A width of the opening may be less than a width of the heavily doped region positioned under the opening. A sum of widths of the plurality of heavily doped regions positioned under the plurality of openings may be less than a width of the first electrode.

The heavily doped region may directly contact the first electrode through the plurality of openings formed in the first area of the anti-reflection layer.

A plurality of uneven portions may be formed on a first surface of the emitter region on the anti-reflection layer. A protrusion shape of uneven portions formed on the lightly doped region, formed under the second area of the anti-reflection layer, at the first surface of the emitter region may have a pyramid shape.

A protrusion shape of uneven portions formed on the heavily doped region, exposed through the plurality of openings formed in the first area of the anti-reflection layer, at the first surface of the emitter region may have a shape different from a pyramid shape.

A protrusion height of uneven portions formed on the heavily doped region exposed through the plurality of openings formed in the first area of the anti-reflection layer at the first surface of the emitter region may be less than a protrusion height of uneven portions formed on the lightly doped region formed under the second area of the anti-reflection layer at the first surface of the emitter region.

The first electrode may not be buried in the emitter region and may contact the surface of the emitter region exposed through the plurality of openings of the anti-reflection layer.

The first electrode may include a seed layer positioned on the first surface of the emitter region exposed through the plurality of openings and a conductive metal layer positioned on the seed layer. The seed layer may contain nickel, and the conductive metal layer may contain at least one of copper (Cu), tin (Sn), and silver (Ag).

BRIEF DESCRIPTION OF THE DRAWINGS

The accompanying drawings, which are included to provide a further understanding of the disclosure and are incorporated in and constitute a part of this specification, illustrate embodiments of the invention and together with the description serve to explain the principles of the invention. In the drawings.

DETAILED DESCRIPTION OF THE EMBODIMENTS

Figure 1:
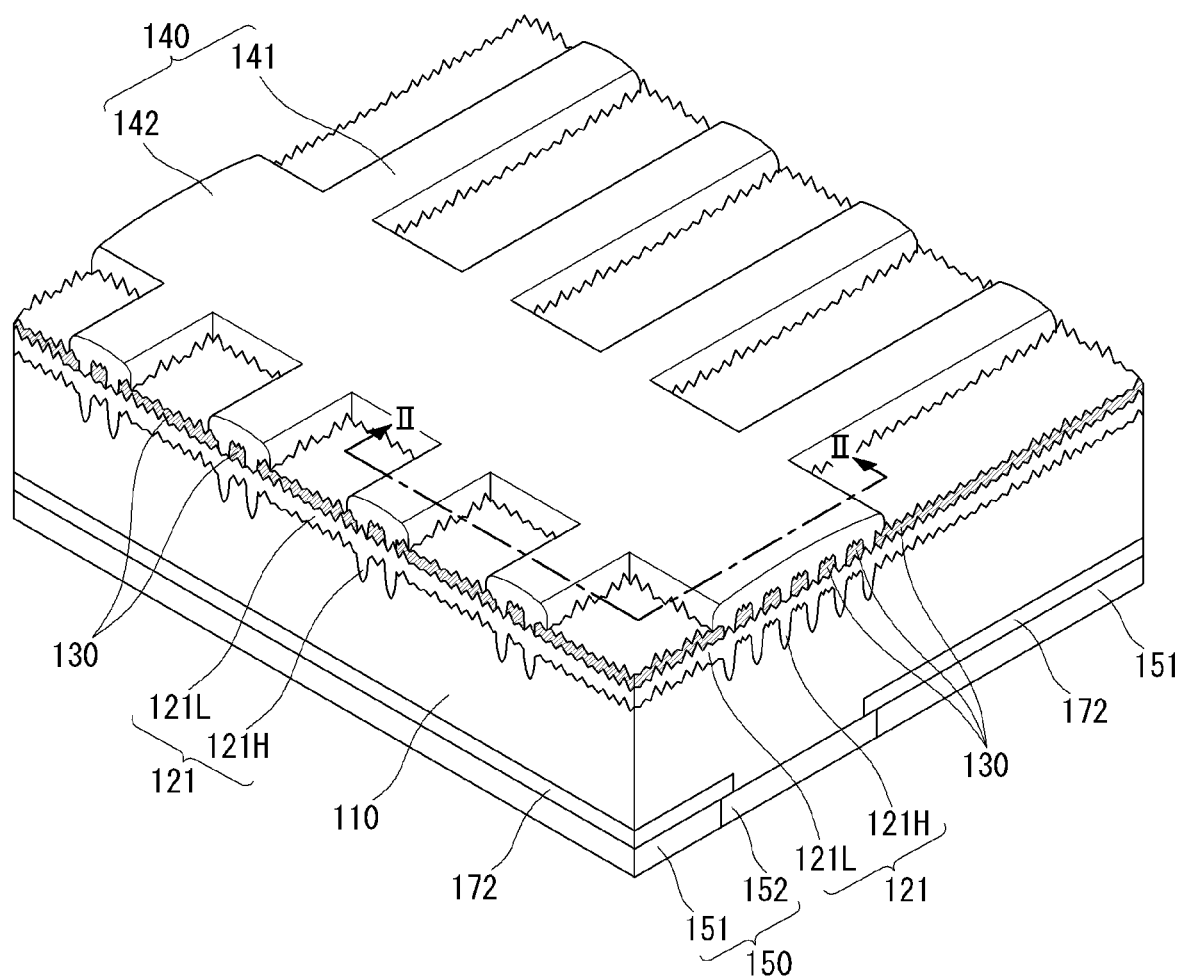
FIG. 1 is a partial perspective view of a solar cell according to an exemplary embodiment of the invention.

Reference will now be made in detail to embodiments of the invention, examples of which are illustrated in the accompanying drawings. This invention may, however, be embodied in many different forms and should not be construed as limited to the embodiments set forth herein. Wherever possible, the same reference numbers may be used throughout the drawings to refer to the same or like parts. It should be understood that detailed description of known arts may be omitted if it is determined that the arts do not aid in the understanding of the embodiments of the invention.

In the drawings, the thickness of layers, films, panels, regions, etc., may be exaggerated for clarity. It will be understood that when an element such as a layer, film, region, or substrate is referred to as being "on" another element, it can be directly on the other element or intervening elements may also be present.

In contrast, when an element is referred to as being "directly on" another element, there are no intervening elements present. Further, it will be understood that when an element such as a layer, film, region, or substrate is referred to as being "entirely" on other element, it may be on the entire surface of the other element and may not be on a portion of an edge of the other element.

Further, a first surface of a layer or a component is one surface of the layer or the layer or the component which is voluntarily selected, and a second surface of the layer or the component is a surface opposite the first surface. The first and second surfaces of the layer or the component may be positioned in the same direction.

Exemplary embodiments of the invention will be described with reference to FIGS. 1 to 10.

A solar cell according to an exemplary embodiment of the invention is described in detail with reference to FIGS. 1 and 2.

Figure 2:
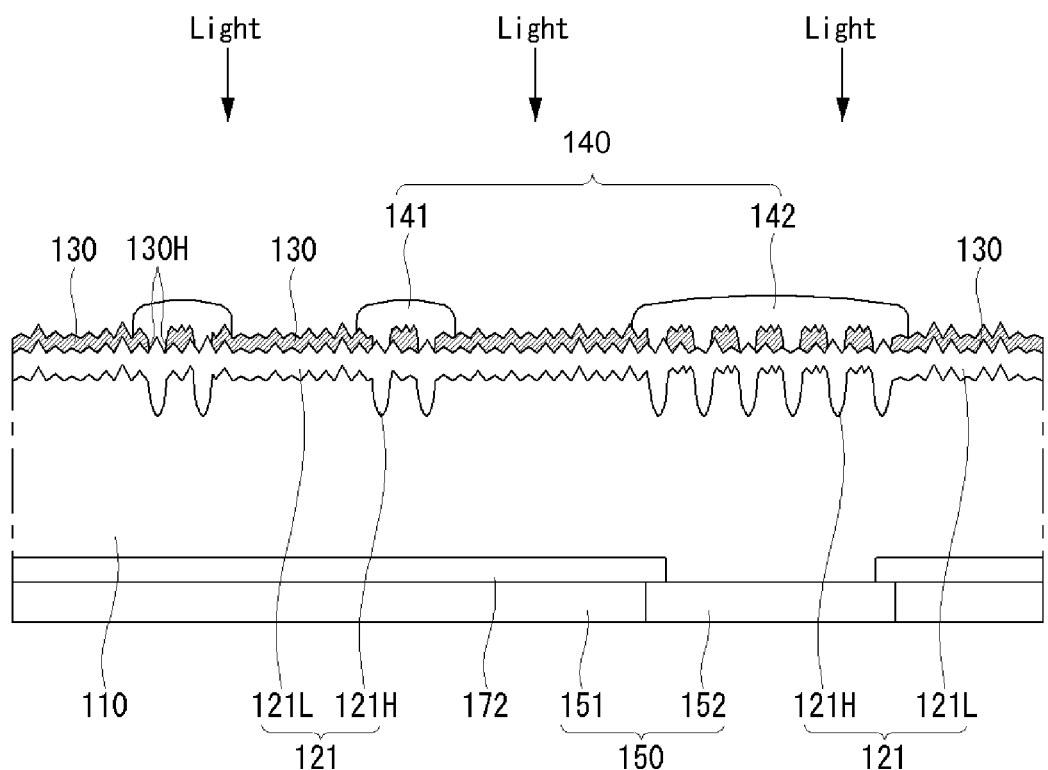
FIG. 2 is a cross-sectional view taken along line II-II of FIG. 1.

As shown in FIGS. 1 and 2, the solar cell according to an exemplary embodiment of the invention includes a substrate 110, an emitter region 121 positioned at a first surface of the substrate 110, an anti-reflection layer 130 positioned on the emitter region 121, a first electrode 140 positioned on the first surface of the substrate 110, a back surface field region 172 positioned at a second surface opposite the first surface of the substrate 110, and a second electrode 150 positioned on the back surface field region 172 and the second surface of the substrate 110.

In the embodiment of the invention, the first surface is one surface which is voluntarily selected, and the second surface is a surface opposite the first surface. Directions of first and second surfaces of each component (for example, the substrate 110, the emitter region 121, the anti-reflection layer 130, etc.) are based on directions of the first and second surfaces of the substrate 110.

The substrate 110 is a semiconductor substrate formed of a semiconductor such as first conductive type silicon, for example, p-type silicon, though not required. The semiconductor used in the substrate 110 is a crystalline semiconductor, such as single crystal silicon and polycrystalline silicon.

When the substrate 110 is of a p-type, the substrate 110 is doped with impurities of a group III element such as boron (B), gallium (Ga), and indium (In). Alternatively, the substrate 110 may be of an n-type and/or may be formed of a semiconductor material other than silicon.

If the substrate 110 is of the n-type, the substrate 110 may be doped with impurities of a group V element such as phosphorus (P), arsenic (As), and antimony (Sb).

The first surface of the substrate 110 may be textured to form a textured surface corresponding to an uneven surface having a plurality of protrusions and a plurality of depressions or having uneven characteristics. In this instance, a surface area of the substrate 110 may increase because of the textured surface of the substrate 110, and thus an incidence area of light may increase. Further, because an amount of light reflected by the substrate 110 may decrease, an amount of light incident on the substrate 110 may increase.

The emitter region 121 is an impurity doped region doped with impurities of a second conductive type (for example, n-type) opposite the first conductive type (for example, p-type) of the substrate 110. The emitter region 121 is positioned at the first surface of the substrate 110. Thus, the emitter region 121 of the second conductive type forms a p-n junction along with a first conductive type region of the substrate 110.

The emitter region 121 includes a lightly doped region 121L and a heavily doped region 121H each having a different sheet resistance. Namely, when the lightly doped region 121L has a first sheet resistance, the heavily doped region 121H has a second sheet resistance less than the first sheet resistance.

Accordingly, the emitter region 121 had a selective emitter structure including the lightly doped region 121L and the heavily doped region 121H each having the different sheet resistance. The emitter region 121 of the selective emitter structure may be formed using a laser. This will be described in detail later.

FIGS. 1 and 2 show that the emitter region 121 of the solar cell according to the embodiment of the invention has the selective emitter structure. However, the embodiment of the invention may be applied to a solar cell including an emitter region having structures other than the selective emitter structure. In the following description, the embodiment of the invention is described based on the emitter region 121, which has the relatively high efficiency due to the selective emitter structure.

Impurity doping thicknesses of the lightly doped region 121L and the heavily doped region 121H may be different from each other due to a difference between formation methods of the lightly doped region 121L and the heavily doped region 121H.

In the embodiment of the invention, an impurity doping thickness of the lightly doped region 121L is less than an impurity doping thickness of the heavily doped region 121H. Thus, an impurity doping concentration of the lightly doped region 121L is lower than an impurity doping concentration of the heavily doped region 121H.

Further, a sheet resistance of the lightly doped region 121L is greater than a sheet resistance of the heavily doped region 121H. For example, the sheet resistance of the lightly doped region 121L may be about 80 Ω/sq. to 120 Ω/sq., and the sheet resistance of the heavily doped region 121H may be about 10 Ω/sq. to 50 Ω/sq. The sheet resistances of the lightly doped region 121L and the heavily doped region 121H are not limited thereto.

A p-n junction surface (hereinafter, referred to as "a first junction surface") between the lightly doped region 121L and the substrate 110 (i.e., the first conductive type region of the substrate 110) and a p-n junction surface (hereinafter, referred to as "a second junction surface") between the heavily doped region 121H and the substrate 110 are positioned at different height levels. Thus, a thickness between the second surface of the substrate 110 and the first junction surface is greater than a thickness between the second surface of the substrate 110 and the second junction surface.

Regarding carriers, for example, electrons and holes produced by light incident on the substrate 110, the electrons and the holes respectively move to the n-type semiconductor and the p-type semiconductor by a built-in potential difference resulting from the p-n junction between the substrate 110 and the emitter region 121.

Thus, when the substrate 110 is of the p-type and the emitter region 121 is of the n-type, the electrons move to the emitter region 121, and the holes move to the second surface of the substrate 110.

Because the emitter region 121 forms the p-n junction along with the substrate 110, the emitter region 121 may be of the p-type when the substrate 110 is of the n-type unlike the embodiment described above. In this instance, the electrons move to the second surface of the substrate 110, and the holes move to the emitter region 121.

Returning to the embodiment of the invention, when the emitter region 121 is of the n-type, the emitter region 121 may be doped with impurities of a group V element such as P, As, and Sb. On the contrary, when the emitter region 121 is of the p-type, the emitter region 121 may be doped with impurities of a group III element such as B, Ga, and In.

It is preferable, but not required, that the sheet resistance of the lightly doped region 121L is about 80 Ω/sq. to 120 Ω/sq., so as to increase an amount of light incident on the substrate 110 through a reduction in an amount of light absorbed in the lightly doped region 121L and to reduce an amount of carriers lost by impurities.

It is preferable, but not required, that the sheet resistance of the heavily doped region 121H is about 10 Ω/sq. to 50 Ω/sq., so as to reduce a contact resistance between the heavily doped region 121H and the first electrode 140 and to reduce an amount of carriers lost by the contact resistance during the movement of carriers.

As shown in FIGS. 1 and 2, the anti-reflection layer 130 is positioned on a first surface of the emitter region 121. The anti-reflection layer 130 may be formed of at least one of silicon nitride (SiNx), silicon oxide (SiOx), silicon oxynitride (SiOxNy), and aluminum oxide ($Al_2O_3$). Other materials may be used for the anti-reflection layer 130.

FIGS. 1 and 2 show the anti-reflection layer 130 having a single-layered structure. However, the anti-reflection layer 130 may have a multi-layered structure, so as to increase the efficiency of the solar cell.

A thickness of the anti-reflection layer 130 may be about 50 nm to 500 nm. Other thicknesses may be used for the anti-reflection layer 130.

The anti-reflection layer 130 reduces a reflectance of light incident on the solar cell and increases selectivity of a predetermined wavelength band, thereby increasing the efficiency of the solar cell. The anti-reflection layer 130 may perform a passivation function, which converts a defect, for example, dangling bonds existing at and around the surface of the substrate 110 into stable bonds using hydrogen (H) contained in the anti-reflection layer 130 to thereby prevent or reduce a recombination and/or a disappearance of carriers moving to the surface of the substrate 110. Thus, the anti-reflection layer 130 reduces an amount of carriers lost by the defect at and around the surface of the substrate 110 to thereby improve the efficiency of the solar cell.

Figure 3:
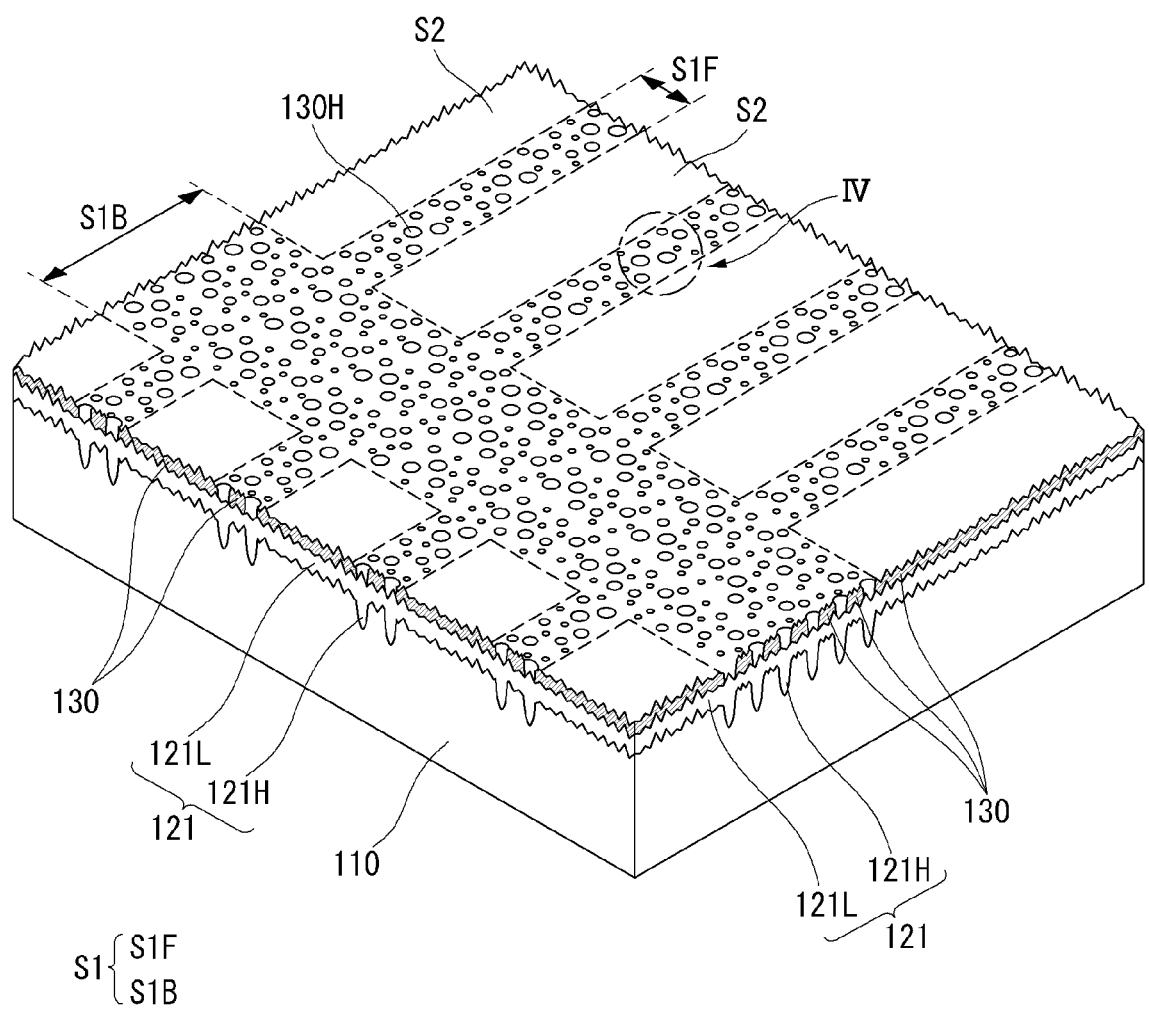
FIG. 3 illustrates a state where a first electrode is removed from the solar cell shown in FIGS. 1 and 2.

As shown in FIG. 3, the anti-reflection layer 130 is positioned under the first electrode 140 as well as on the emitter region 121. A plurality of openings 130H may be formed in a first area 51 of the anti-reflection layer 130, which is positioned under the first electrode 140. This will be described in detail later.

As shown in FIGS. 1 and 2, the first electrode 140 includes a plurality of finger electrodes 141 and a plurality of front bus bars 142.

The finger electrodes 141 are separated from one another and extend parallel to one another in a fixed direction. The finger electrodes 141 collect carriers (for example, electrons) moving to the emitter region 121.

The front bus bars 142 are separated from one another and extend parallel to one another in a direction crossing the finger electrodes 141. The front bus bars 142 electrically connect the finger electrodes 141 to one another.

The first electrode 140 electrically contacts the emitter region 121, which is exposed through the plurality of openings 130H positioned in the first area S1 of the anti-reflection layer 130. Thus, at least one of the finger electrode 141 and the front bus bar 142 included in the first electrode 140 may electrically contact the emitter region 121 through the plurality of openings 130H positioned in the first area S1 of the anti-reflection layer 130.

As shown in FIG. 1, the plurality of finger electrodes 141 have a stripe shape extending in a transverse (or longitudinal) direction, and the plurality of front bus bars 142 have a stripe shape extending in a direction crossing the finger electrodes 141, for example, in a longitudinal (or transverse) direction. Hence, the first electrode 140 has a lattice shape on the first surface of the substrate 110.

The front bus bars 142 collect carriers, which are collected by the finger electrodes 141 and move, and then transfer the collected carriers to an external device.

The front bus bars 142 have to collect carriers collected by the finger electrodes 141 crossing the front bus bars 142 and have to move the collected carriers in a desired direction. Therefore, a width of each front bus bar 142 may be greater than a width of each finger electrode 141.

The first electrode 140 including the finger electrodes 141 and the front bus bars 142 may be formed of at least one conductive material, for example, silver (Ag).

In the embodiment of the invention, the number of finger electrodes 141 and the number of front bus bars 142 may vary, if desired or necessary.

The back surface field region 172 positioned at the second surface of the substrate 110 is a region (for example, a $p^+$-type region) which is more heavily doped than the substrate 110 with impurities of the same conductive type as the substrate 110.

A potential barrier is formed by a difference between impurity doping concentrations of the first conductive type region of the substrate 110 and the back surface field region 172. Hence, the potential barrier prevents or reduces electrons from moving to the back surface field region 172 used as a moving path of holes and makes it easier for holes to move to the back surface field region 172. Thus, the back surface field region 172 reduces an amount of carriers lost by a recombination and/or a disappearance of electrons and holes at and around the second surface of the substrate 110 and accelerates a movement of desired carriers (for example, holes), thereby increasing the movement of carriers to the second electrode 150.

The second electrode 150 includes a back electrode layer 151 and a plurality of back bus bars 152 connected to the back electrode layer 151.

The back electrode layer 151 contacts the back surface field region 172 positioned at the second surface of the substrate 110 and is substantially positioned on the entire second surface of the substrate 110 except an edge of the second surface of the substrate 110 and a formation area of the back bus bars 152.

The back electrode layer 151 contains impurities of the first conductive type. For example, the back electrode layer 151 may contain a conductive material, for example, aluminum (Al).

The back electrode layer 151 collects carriers (for example, holes) moving to the back surface field region 172.

Because the back electrode layer 151 contacts the back surface field region 172 having the impurity doping concentration higher than the substrate 110, a contact resistance between the substrate 110 (i.e., the back surface field region 172) and the back electrode layer 151 decreases. Hence, the transfer efficiency of carriers from the substrate 110 to the back electrode layer 151 is improved.

The plurality of back bus bars 152 are positioned on the second surface of the substrate 110, on which the back electrode layer 151 is not positioned, and are connected to the back electrode layer 151.

Further, the back bus bars 152 are positioned opposite the front bus bars 142 at a location corresponding to the front bus bars 142 with the substrate 110 interposed therebetween.

The back bus bars 152 collect carriers transferred from the back electrode layer 151, similar to the front bus bars 142.

The back bus bars 152 are connected to the external device, and thus carriers (for example, holes) collected by the back bus bars 152 are outputted to the external device.

The back bus bars 152 may be formed of a material having better conductivity than the back electrode layer 151. For example, the back bus bars 152 may contain at least one conductive material such as silver (Ag).

An operation of the solar cell having the above-described structure is described below.

When light irradiated to the solar cell is incident on the substrate 110 through the anti-reflection layer 130, a plurality of electron-hole pairs are generated in the semiconductor part by light energy produced based on the incident light. In this instance, because a reflection loss of the light incident on the substrate 110 is reduced by the textured surface of the substrate 110 and the anti-reflection layer 130, an amount of light incident on the substrate 110 increases.

The electron-hole pairs are separated into electrons and holes due to the p-n junction of the substrate 110 and the emitter region 121. The electrons move to the n-type emitter region 121, and the holes move to the p-type substrate 110. The electrons moving to the emitter region 121 are collected by the finger electrodes 141 and the front bus bars 142 and move along the front bus bars 142. The holes moving to the substrate 110 are collected by the back electrode layer 151 and the back bus bars 152 and move along the back bus bars 152. When the front bus bars 142 are connected to the back bus bars 152 using conductive wires, current flows therein to thereby enable use of the current for electric power.

In the embodiment of the invention, a loss amount of carriers decreases due to the emitter region 121 having the selective emitter structure, and an amount of carriers moving to the first electrode 140 increases. Hence, the efficiency of the solar cell is greatly improved.

As described above, the anti-reflection layer 130 is positioned under the first electrode 140, and the plurality of openings 130H are formed in the first area S1 of the anti-reflection layer 130, which is positioned under the first electrode 140. Further, the opening 130H may not be formed in a second area S2 of the anti-reflection layer 130, in which the first electrode 140 is not positioned.

However, the embodiment of the invention is not limited thereto. A portion of the openings 130H may be formed in the second area S2 of the anti-reflection layer 130 beyond the first area S1 of the anti-reflection layer 130. In the following description, the embodiment of the invention is described under condition that the openings 130H are formed only in the first area S1 of the anti-reflection layer 130 for the sake of brevity and ease of reading.

As described above, the emitter region 121 is positioned under the anti-reflection layer 130. In this instance, when the emitter region 121 has the selective emitter structure, the heavily doped region 121H of the emitter region 121 may be formed in the first area S1 (in which the openings 130H are formed) of the anti-reflection layer 130, and the lightly doped region 121L of the emitter region 121 may be formed in the second area S2 of the anti-reflection layer 130, in which the first electrode 140 is not positioned, and in the first area S1 in which the opening 130H is not formed.

The solar cell structure according to the embodiment of the invention may greatly improve the efficiency of the solar cell and may reduce the manufacturing cost and time of the solar cell. The advantages are described in detail below.

First, the solar cell according to the embodiment of the invention locally forms the heavily doped region 121H of the emitter region 121 only under the openings 130H of the anti-reflection layer 130 while maintaining the characteristics of the solar cell having the selective emitter structure, thereby relatively reducing an amount of impurities contained in the emitter region 121 and increasing a short circuit current of the solar cell. Hence, the efficiency of the solar cell may be improved.

The heavily doped region 121H of the emitter region 121 has the sheet resistance less than the lightly doped region 121L of the emitter region 121 and contains more impurities of the second conductive type than the lightly doped region 121L. In this instance, a recombination of carriers (electrons or holes) collected by the heavily doped region 121H may increase due to a relatively large amount of the impurities of the second conductive type contained in the heavily doped region 121H. Hence, the short circuit current of the solar cell may be reduced.

Unlike the embodiment of the invention, if the emitter region 121 overlapping the first area S1 of the anti-reflection layer 130, in which the first electrode 140 is formed, is entirely formed as the heavily doped region 121H, an amount of recombined carriers may relatively increase.

However, in the embodiment of the invention, the emitter region 121 overlapping the first area S1 of the anti-reflection layer 130 is not entirely formed as the heavily doped region 121H, and the heavily doped region 121H of the emitter region 121 is locally formed only under the openings 130H of the anti-reflection layer 130. Thus, an amount of recombined carriers may decrease, and the short circuit current of the solar cell may increase. As a result, the efficiency of the solar cell may be improved.

Secondly, the heavily doped region 121H of the emitter region 121 and the openings 130H of the anti-reflection layer 130 may be formed by locally applying heat (for example, a laser beam) to an upper part of the anti-reflection layer 130 using, for example, a laser. Unlike the embodiment of the invention, when the emitter region 121 positioned under the first area S1 of the anti-reflection layer 130, in which the first electrode 140 will be formed, is entirely formed as the heavily doped region 121H in a state where the lightly doped region 121L of the emitter region 121 is formed at the first surface of the substrate 110 and the anti-reflection layer 130 is formed on the entire surface of the emitter region 121, a relatively large amount of heat has to be applied to the anti-reflection layer 130. For this, an amount of locally irradiated laser beam may increase by increasing power of the laser beam or reducing a moving velocity of the laser beam.

However, in this instance, because a large amount of heat is excessively applied to the substrate 110, the quality of the substrate 110 may be relatively reduced. Hence, lifetime of carriers generated in the substrate 110 due to light may be relatively reduced.

In the manufacturing process of the solar cell according to the embodiment of the invention, an area of the anti-reflection layer 130, in which the first electrode 140 will be formed, is not entirely removed, but is partially removed so that the openings 130H are formed in the first area S1 of the anti-reflection layer 130. When the heavily doped region 121H is formed only in the openings 130H, an amount of heat applied to the substrate 110 may relatively decrease and a reduction in the quality of the substrate 110 may be prevented or reduced. Hence, a reduction in the lifetime of carriers may be prevented or reduced, and the efficiency of the solar cell may be further improved.

Thirdly, the laser beam may be used to remove the anti-reflection layer 130 formed on the emitter region 121. In the solar cell according to the embodiment of the invention, in a process for removing the anti-reflection layer 130 using the laser beam, the first area S1 of the anti-reflection layer 130, in which the first electrode 140 will be formed, is not entirely removed, but is partially removed so that the openings 130H are formed in the first area S1 of the anti-reflection layer 130. Therefore, the moving velocity of the laser beam may increase, or an output voltage of the laser beam may be reduced. Hence, because manufacturing time of the solar cell or the output voltage of the laser beam is reduced, the manufacturing cost of the solar cell may be reduced.

The openings 130H included in the anti-reflection layer 130 and the heavily doped region 121H formed under the openings 130H are described in more detail below.

Figure 4:
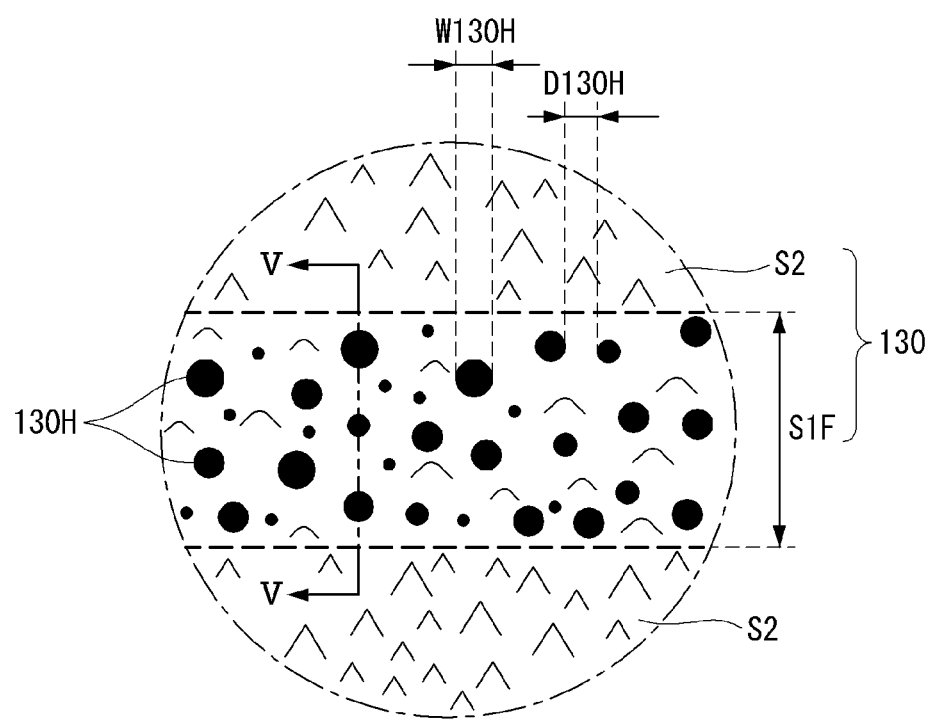
FIG. 4 is an enlarged view of a portion "IV" of FIG. 3.
Figure 5:
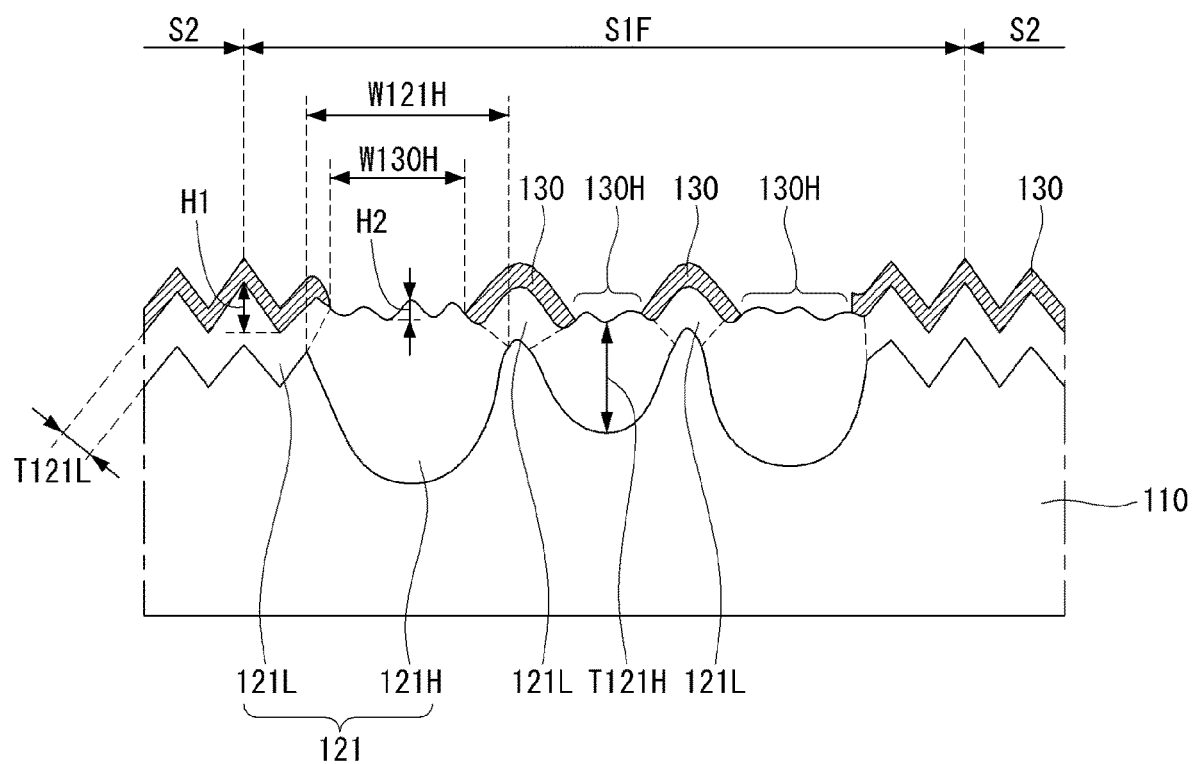
FIG. 5 is an enlarged cross-sectional view taken along line V-V of FIG. 4.

FIG. 3 illustrates a state where the first electrode is removed from the solar cell shown in FIGS. 1 and 2. FIG. 4 is an enlarged view of a portion "IV" of FIG. 3. FIG. 5 is an enlarged cross-sectional view taken along line V-V of FIG. 4.

As shown in FIG. 3, when the first electrode 140 formed on the first area S1 of the anti-reflection layer 130 is removed from the solar cell according to the embodiment of the invention, the first area S1 of the anti-reflection layer 130, from which the first electrode 140 is removed, has the plurality of openings 130H.

As described above, the plurality of openings 130H of the anti-reflection layer 130 are formed in the first area S1 positioned under the first electrode 140 and may not be formed in the second area S2, in which the first electrode 140 is not positioned.

The first area S1 of the anti-reflection layer 130 may include a finger area S1F extending in a first direction and a bus bar area S1B extending in a second direction crossing the first direction. The finger electrodes 141 of the first electrode 140 are positioned in the finger area S1F of the first area S1, and the front bus bars 142 of the first electrode 140 are positioned in the bus bar area S1B of the first area S1.

Further, the heavily doped region 121H of the emitter region 121 may be positioned under the first area S1 of the anti-reflection layer 130. More specifically, the heavily doped region 121H is positioned under each of the openings 130H formed in the first area S1 of the anti-reflection layer 130 and is exposed through the openings 130H.

The lightly doped region 121L of the emitter region 121 may be positioned under the second area S2 of the anti-reflection layer 130 and under a portion of the first area S1. The lightly doped region 121L may be positioned under the first area S1 of the anti-reflection layer 130, except where a formation area of the heavily doped region 121H is positioned under each of the openings 130H.

FIG. 3 shows that the openings 130H formed in the first area S1 of the anti-reflection layer 130 are included in both the finger area S1F and the bus bar area S1B as shown in FIGS. 1 and 2. However, unlike the embodiment of the invention, the openings 130H may be included only in the finger area S1F of the first area S1 of the anti-reflection layer 130.

In this instance, because the openings 130H and the heavily doped region 121H are not formed in the bus bar area S1B of the first area S1 of the anti-reflection layer 130, manufacturing time of the solar cell may be reduced.

The openings 130H formed in the first area S1 of the anti-reflection layer 130 may be separated from one another as shown in FIG. 4 or may be partially connected to one another.

In this instance, because the heavily doped region 121H of the emitter region 121 is positioned under each of the openings 130H, the heavily doped region 121H may be in the plural. When viewed in the plane, the plurality of heavily doped regions 121H may have an island shape, in which the heavily doped regions 121H are partially separated from one another or may be partially connected to one another.

A plane shape of each of the openings 130H may have a dot shape as shown in FIG. 4 or may have a polygon shape.

Further, as shown in FIG. 4, a width of the finger area S1F of the first area S1 of the anti-reflection layer 130 may be about 5 μm to 20 μm. Namely, because the first area S1 of the anti-reflection layer 130 overlaps the finger electrodes 141 formed in the first area S1, a width of each of the finger electrodes 141 may be about 5 μm to 20 μm.

A maximum width W130H of the openings 130H may be equal to or less than about 4 μm, and a maximum distance D130H between the openings 130H may be equal to or less than about 5 μm. However, the embodiment of the invention is not limited thereto.

As described above, the openings 130H are formed in the first area S1 of the anti-reflection layer 130, and the heavily doped region 121H of the emitter region 121 is formed under the openings 130H and is exposed through the openings 130H.

As shown in FIG. 5, the lightly doped region 121L of the emitter region 121 may be formed under the second area S2 of the anti-reflection layer 130 and under the first area S1 of the anti-reflection layer 130, in which the openings 130H are not formed.

Accordingly, a thickness T121H of the heavily doped region 121H positioned under the openings 130H may be greater than a thickness T121L of the lightly doped region 121L positioned under the first area S1 of the anti-reflection layer 130, in which the openings 130H are not formed.

Further, as shown in FIG. 5, a width W130H of the opening 130H may be less than a width W121H of the heavily doped region 121H positioned under the openings 130H. This is because the heavily doped region 121H is additionally formed by diffusing the impurities of the second conductive type contained in a doping paste applied to the anti-reflection layer 130 into the substrate 110, at which the lightly doped region 121L is formed, in a radial direction when a portion of the anti-reflection layer 130 is removed by the laser beam.

A sum of the widths W121H of the plurality of heavily doped regions 121H formed under the plurality of openings 130H may be less than a width of the first area S1 of the anti-reflection layer 130. Thus, the sum of the widths W121H of the heavily doped regions 121H may be less than a width of the first electrode 140.

For example, as shown in FIG. 5, the sum of the widths W121H of the heavily doped regions 121H may be less than a width of the finger area S1F of the anti-reflection layer 130 and may be less than a sum of widths of the finger electrodes 141.

Further, as shown in FIG. 5, a plurality of uneven portions are formed on a first surface of the emitter region 121 abutting on the anti-reflection layer 130. A protrusion shape of uneven portions formed on the lightly doped region 121L (formed under the second area S2 of the anti-reflection layer 130) at the first surface of the emitter region 121 may have a pyramid shape. A protrusion shape of uneven portions formed on the heavily doped region 121H (exposed through the openings 130H formed in the first area S1 of the anti-reflection layer 130) at the first surface of the emitter region 121 may have a shape different from the pyramid shape.

The protrusion shape of the uneven portions formed on the heavily doped region 121H does not have a uniformly specific shape, for example, the pyramid shape of the uneven portions formed on the lightly doped region 121L. Namely, the uneven portions of the heavily doped region 121H have various protrusion shapes (or non-uniform shape).

A protrusion height H2 of the uneven portions formed on the heavily doped region 121H (exposed through the openings 130H formed in the first area S1 of the anti-reflection layer 130) at the first surface of the emitter region 121 may be less than a protrusion height H1 of the uneven portions formed on the lightly doped region 121L (formed under the second area S2 of the anti-reflection layer 130) at the first surface of the emitter region 121.

Figure 6:
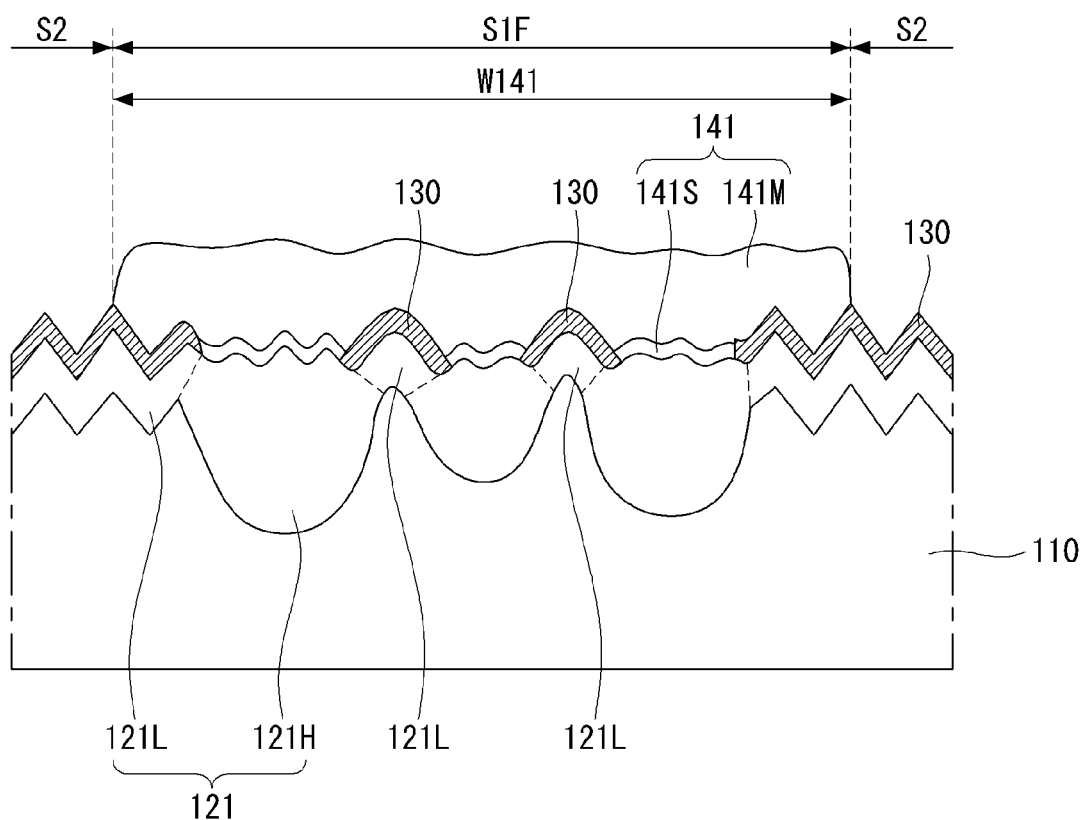
FIG. 6 illustrates an example where a first electrode is formed in a first area of an anti-reflection layer.

FIG. 6 illustrates an example where the first electrode 140 is formed in the first area S1 of the anti-reflection layer 130.

As shown in FIG. 6, the heavily doped region 121H of the emitter region 121 directly contacts and is electrically connected to the first electrode 140 including the finger electrodes 141 through the openings 130H formed in the first area S1 of the anti-reflection layer 130.

FIG. 6 shows only the finger electrodes 141 of the first electrode 140. However, the structure of FIG. 6 may be equally applied to the front bus bars 142 of the first electrode 140.

The first electrode 140 including the finger electrodes 141 may be formed using a plating method. Thus, the first electrode 140 is not buried in the emitter region 121 and may contact the surface of the emitter region 121 exposed through the openings 130H of the anti-reflection layer 130.

The structure of FIG. 6, in which the first electrode 140 including the finger electrodes 141 is not buried or embedded in the emitter region 121 and contacts the surface of the emitter region 121, may achieve a self-alignment in the manufacturing process. Therefore, the manufacturing process may be further simplified.

Because the first electrode 140 including the finger electrodes 141 is not buried or embedded in the emitter region 121, the problem, in which the first electrode 140 passes through the emitter region 121 and is short-circuited with the substrate 110, is not generated. Further, a contact resistance between the first electrode 140 and the emitter region 121 may be further reduced due to characteristics of the plating method.

The first electrode 140, for example, the finger electrodes 141 formed on the first area S1 of the anti-reflection layer 130 may include a seed layer 141S positioned on the first surface of the emitter region 121 exposed through the openings 130H and a conductive metal layer 141M positioned on the seed layer 141S.

In the embodiment of the invention, the seed layer 141S may contain nickel, and the conductive metal layer 141M may contain at least one of copper (Cu), tin (Sn), and silver (Ag).

For example, the conductive metal layer 141M may contain copper (Cu) and tin (Sn) as a main component or may contain silver (Ag) as the main component.

As described above, FIG. 6 shows only the finger electrodes 141 of the first electrode 140 as an example. However, the front bus bars 142 of the first electrode 140 may have the same structure as the finger electrodes 141. The description of FIG. 6 may be equally applied to a portion of the anti-reflection layer 130, on which the front bus bars 142 are formed.

FIGS. 7 to 10 illustrate a method for manufacturing the solar cell according to an embodiment of the invention.

Figure 7:
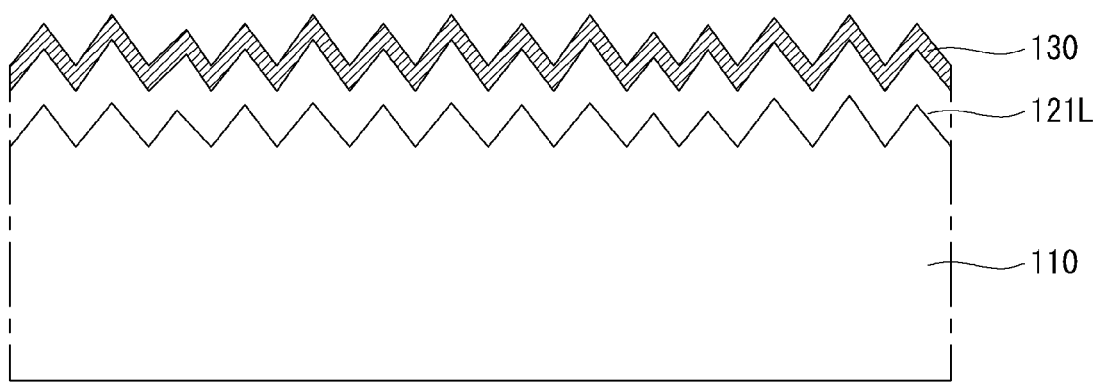
FIGS. 7 to 10 illustrate a method for manufacturing a solar cell according to an exemplary embodiment of the invention.

First, as shown in FIG. 7, a substrate 110, in which a lightly doped region 121L of an emitter region 121 and an anti-reflection layer 130 are formed on a first surface thereof, is provided. In this instance, the lightly doped region 121L and the anti-reflection layer 130 may be formed on the first surface of the substrate 110 using various methods.

For example, the lightly doped region 121L of the emitter region 121 containing impurities (for example, phosphorus (P)) of a second conductive type (for example, n-type) is formed at the first surface of the substrate 110 of a first conductive type (for example, p-type), which is formed of single crystal silicon or polycrystalline silicon.

In alternative example, before forming the lightly doped region 121L or after forming the lightly doped region 121L, a dry etching method such as a reaction ion etching method or a wet etching method may be performed on the flat first surface (or the surface of the lightly doped region 121L) of the substrate 110 or the flat first surface and a flat second surface of the substrate 110 to form a textured surface corresponding to an uneven surface having a plurality of protrusions and a plurality of depressions or having uneven characteristics on the first surface of the substrate 110 or the first and second surfaces of the substrate 110.

Next, an anti-reflection layer 130 may be formed on the lightly doped region 121L formed at the first surface of the substrate 110 using a deposition method such as a plasma enhanced chemical vapor deposition (PECVD) method.

As described above, the lightly doped region 121L and the anti-reflection layer 130 may be formed on the first surface of the substrate 110.

Figure 8:
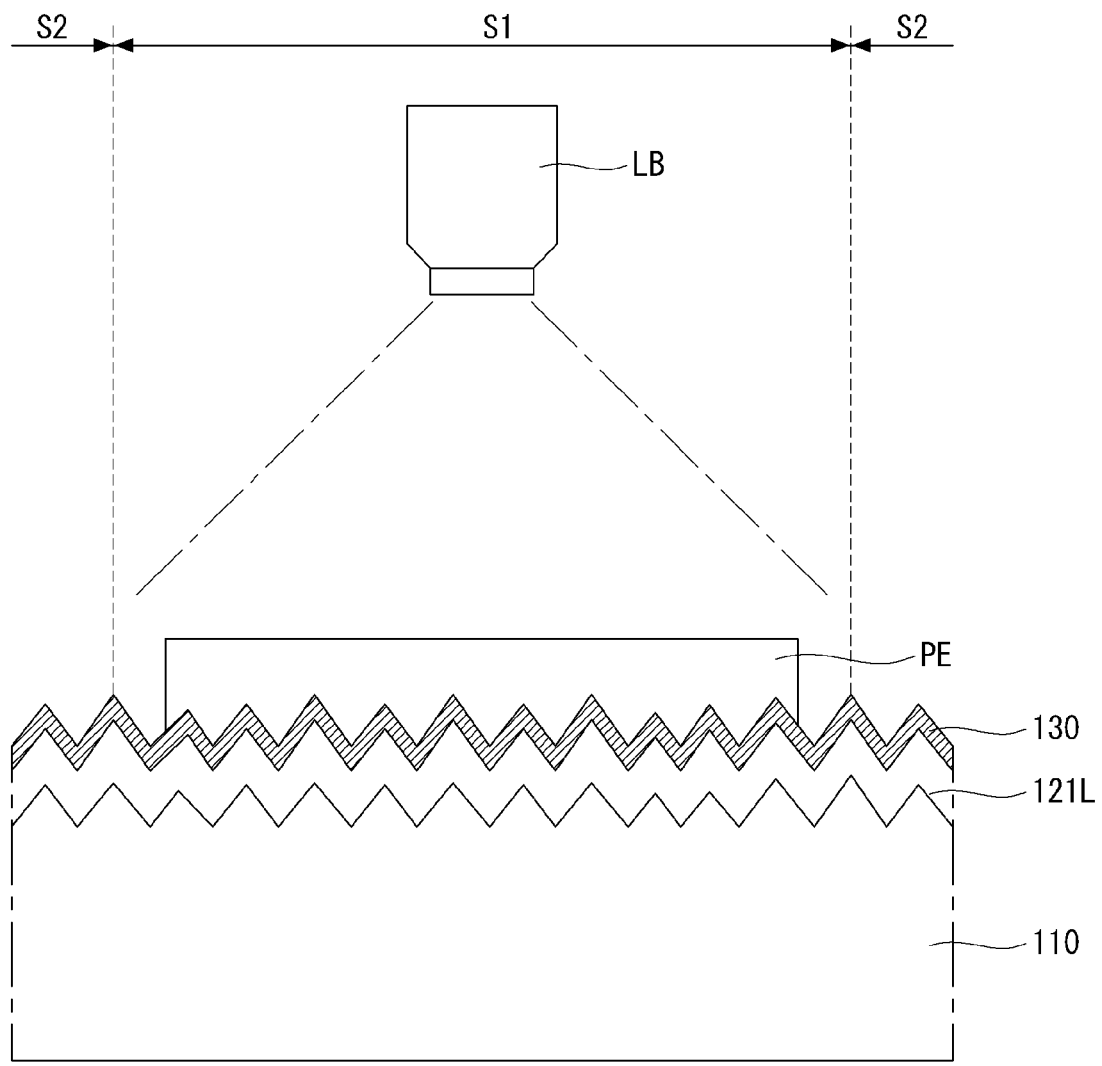

Subsequently, as shown in FIG. 8, a doping paste PE containing the impurities of the second conductive type is formed on a first area 51 of the anti-reflection layer 130.

The doping paste PE may be formed on the first area 51 of the anti-reflection layer 130 using an inkjet printing method, a spin coating method, or a screen printing method, etc.

As shown in FIG. 8, when the doping paste PE is applied to the first area 51 of the anti-reflection layer 130, a laser beam is irradiated onto the first area 51 of the anti-reflection layer 130, to which the doping paste PE is applied, using a laser irradiation device LB.

Figure 9:
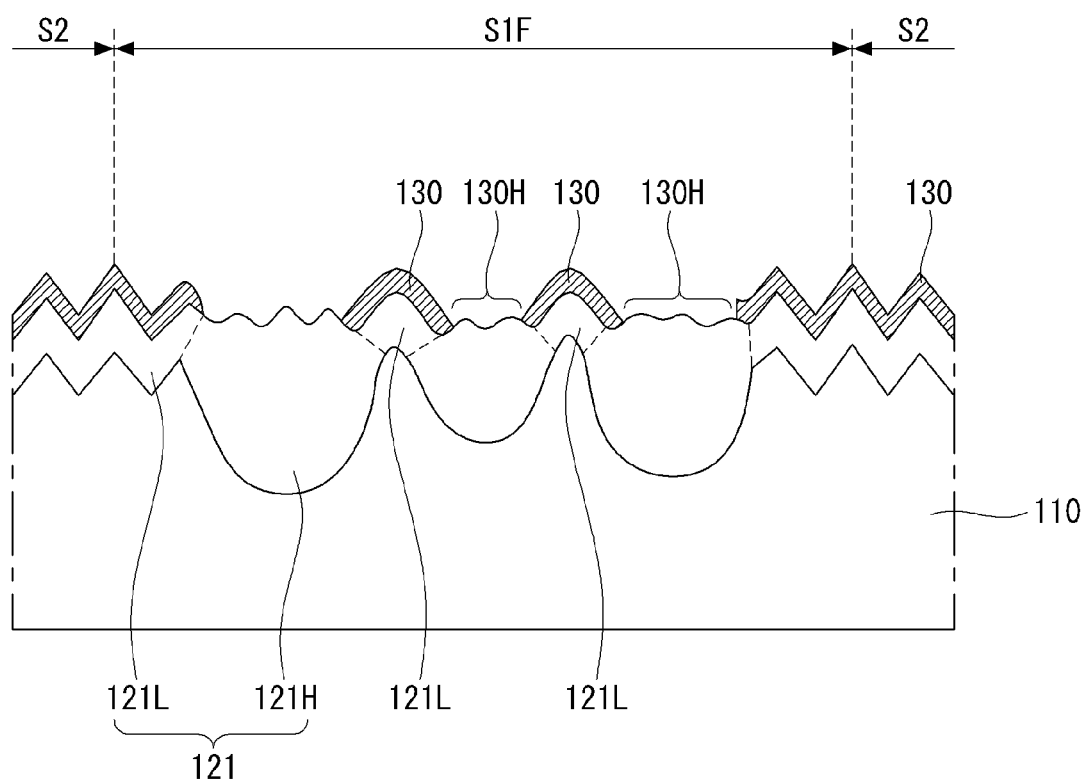

As shown in FIG. 9, when the laser beam is irradiated onto the first area 51 of the anti-reflection layer 130, a plurality of openings 130H may be formed in the first area 51 of the anti-reflection layer 130.

The arrangement of the plurality of openings 130H formed in the first area S1 of the anti-reflection layer 130 is substantially the same as the arrangement described in FIGS. 3 to 5.

Figure 10:
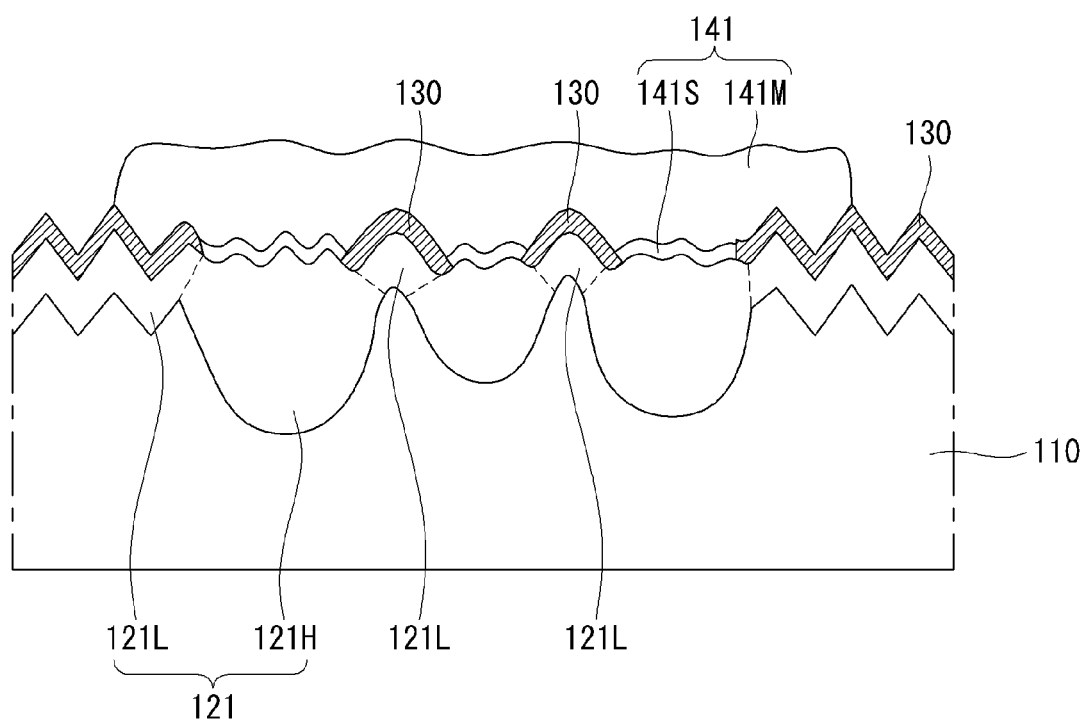

Next, as shown in FIG. 10, finger electrodes 141 may be formed in the first area S1 of the anti-reflection layer 130 using a plating method. FIG. 10 shows only the finger electrodes 141 of a first electrode 140 as an example. However, front bus bars 142 of the first electrode 140 may be formed using the same method as the finger electrodes 141.

Afterwards, as shown in FIGS. 1 and 2, a second electrode 150 and a back surface field region 172 are formed on the second surface of the substrate 110. Thus, the solar cell according to the embodiment of the invention is completed.

As described above, the solar cell according to the embodiment of the invention may relatively increase a moving velocity of the laser beam when the laser beam is irradiated onto the first area S1 of the anti-reflection layer 130, and may relatively reduce power of the output laser beam. Thus, the manufacturing cost and time of the solar cell may be further reduced.

For example, the power of the laser beam output by the laser irradiation device LB may be about 5 W to 25 W, and the moving velocity of the laser beam output by the laser irradiation device LB may be about 0.5 m/s to 10 m/s.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell comprising:
a substrate containing impurities of a first conductive type;
an emitter region on a first surface of the substrate, the emitter region containing impurities of a second conductive type opposite the first conductive type and forming a p-n junction with the substrate, wherein the emitter region includes a plurality of heavily doped regions and a lightly doped region;
an anti-reflection layer on the emitter region and having at least a plurality of first openings and a plurality of second openings;
a first electrode on the anti-reflection layer, the first electrode including finger electrodes extending in a first direction and coupled to the plurality of heavily doped regions through the plurality of first openings and bus bars extending in a second direction crossing the first direction and coupled to the plurality of heavily doped regions through the plurality of second openings; and
a second electrode on a second surface of the substrate,
wherein the plurality of first openings comprises first openings under one of the finger electrodes arranged in the second direction,
wherein the plurality of second openings comprises second openings under one of the bus bars arranged in the first direction,
wherein the plurality of heavily doped regions of the emitter region comprises first heavily doped regions aligned with the first openings under the one of the finger electrodes arranged in the second direction, and the lightly doped region of the emitter region comprises a first portion of the lightly doped region positioned between the first heavily doped regions under the one of the finger electrodes arranged in the second direction and having a doping concentration lower than a doping concentration of the plurality of heavily doped regions,
wherein the plurality of heavily doped regions of the emitter region comprises second heavily doped regions aligned with the second openings under the one of the bus bars arranged in the first direction, and the lightly doped region of the emitter region comprises a second portion of the lightly doped region positioned between the second heavily doped regions under the one of the bus bars arranged in the first direction and having the doping concentration lower than the doping concentration of the plurality of heavily doped regions,
wherein the lightly doped region of the emitter region comprises a third portion of the lightly doped region formed under the anti-reflection layer at other portions except the finger electrodes and the bus bars,
wherein a plurality of uneven portions are formed on a first surface of the emitter region, where the first surface of the emitter region faces the anti-reflection layer and the first electrode, and
wherein a protrusion height of the uneven portions on the first portion of the lightly doped region is larger than a protrusion height of the uneven portions on the first heavily doped regions, and a protrusion height of the uneven portions on the third portion of the lightly doped region is larger than the protrusion height of the uneven portions on the first heavily doped region.

2. The solar cell of claim 1, wherein a plane shape of the plurality of first and second openings has a circular shape or a polygon shape.

3. The solar cell of claim 1, wherein a sum of widths of the plurality of heavily doped regions under the first and second openings is less than a width of the first electrode.

4. The solar cell of claim 1, wherein the heavily doped regions directly contact the first electrode through the plurality of first and second openings.

5. The solar cell of claim 1, wherein a protrusion shape of the uneven portions on the third portion of the lightly doped region at the first surface of the emitter region has a pyramid shape.

6. The solar cell of claim 5, wherein a protrusion shape of the uneven portions on the heavily doped region, exposed through each of the plurality of first and second openings, at the first surface of the emitter region, has a shape different from a pyramid shape.

7. The solar cell of claim 1, wherein a protrusion height of the uneven portions on the second heavily doped regions is less than the protrusion height of the uneven portions on the third portion of the lightly doped region.

8. The solar cell of claim 1, wherein the first electrode is not buried in the emitter region and contacts the first surface of the emitter region exposed through the plurality of first and second openings of the anti-reflection layer.

9. The solar cell of claim 1, wherein the first electrode comprises a plurality of seed layers on the plurality of heavily doped regions of the emitter region, and a conductive metal layer on the plurality of seed layers.

10. The solar cell of claim 1, wherein a width of each of the first and second openings is less than a width of the heavily doped region under each of the first and second openings, respectively.

11. The solar cell of claim 1, wherein protrusion shapes of the uneven portions on the heavily doped regions, the third portion of the lightly doped region and the first portion of the lightly doped region are different from each other.

12. The solar cell of claim 1, wherein:
the lightly doped region has a first thickness;
the first heavily doped regions include a first region having a second thickness larger than the first thickness and a second region having a third thickness larger than the first thickness and smaller than the second thickness; and
the second heavily doped regions include a third region having a fourth thickness larger than the first thickness and a fourth region having a fifth thickness larger than the first thickness and smaller than the fourth thickness.

13. The solar cell of claim 12, wherein a width of the first openings aligned with the first region is larger than a width of the first openings aligned with the second region and a width of the second openings aligned with the third region is larger than a width of the second openings aligned with the fourth region.

* * * * *